(12) United States Patent
Sweeting

(10) Patent No.: US 7,272,520 B2
(45) Date of Patent: Sep. 18, 2007

(54) METHOD AND APPARATUS FOR DETERMINING A CURRENT IN A CONDUCTOR

(75) Inventor: David Keith Sweeting, St. Ives (AU)

(73) Assignee: CHK Wireless Technologies of Australia PTY (AU)

( * ) Notice: Subject to any disclaimer, the term of this patent is extended or adjusted under 35 U.S.C. 154(b) by 0 days.

(21) Appl. No.: 10/845,892

(22) Filed: May 14, 2004

(65) Prior Publication Data

US 2005/0068020 A1   Mar. 31, 2005

Related U.S. Application Data

(63) Continuation of application No. PCT/AU02/01566, filed on Nov. 19, 2002.

(60) Provisional application No. 60/331,560, filed on Nov. 19, 2001.

(51) Int. Cl.
   *G01R 33/00* (2006.01)
(52) U.S. Cl. .............................. 702/64; 702/65; 324/200
(58) Field of Classification Search ................. 702/57, 702/64–66, 127, 189, 198, 59; 324/117 R, 324/107, 117 H, 127, 129, 144, 543, 244, 324/260, 265, 200, 213, 227, 228; 307/89; 703/4, 13; 708/817, 832
   See application file for complete search history.

(56) References Cited

U.S. PATENT DOCUMENTS

| | | | |
|---|---|---|---|
| 3,851,229 A | 11/1974 | Hayne et al. | 361/229 |
| 5,296,810 A * | 3/1994 | Morich | 324/318 |
| 5,311,128 A * | 5/1994 | Lareau et al. | 324/233 |
| 5,408,176 A | 4/1995 | Blatt | 324/107 |
| 6,144,196 A | 11/2000 | Tamaki | 324/117 R |

(Continued)

FOREIGN PATENT DOCUMENTS

EP    0454360    10/1991

(Continued)

OTHER PUBLICATIONS

Hagel et al., "On the magnetic field of an infinitely long helical line current", Jan. 1994, IEEE Transactions on Magnetics, vol. 30, issue 1, pp. 80-84.*

(Continued)

*Primary Examiner*—Hal Wachsman
(74) *Attorney, Agent, or Firm*—Ganzlaw, P.C.

(57) ABSTRACT

The present invention provides a method of determining a current in a conductor. The method comprises the steps of determining the $n^{th}$ spatial derivative of at least one vector component of the magnetic field associated with the current at at least one position and calculating the current from the $n^{th}$ spatial derivative. The present invention also provides an apparatus for determining a current in a conductor. The apparatus comprises a means for determining at least one vector component of the magnetic field associated with the current at at least two different positions and a means for determining the $n^{th}$ spatial derivative of at least one vector component of the magnetic field from the or each vector component of the magnetic field measured at the at least two positions. The apparatus also comprises a means for calculating the current from the $n^{th}$ spatial derivative.

25 Claims, 2 Drawing Sheets

U.S. PATENT DOCUMENTS

| | | | |
|---|---|---|---|
| 6,437,554 B1 | 8/2002 | Atwater | 324/117 R |
| 6,538,437 B2 * | 3/2003 | Spitzer et al. | 324/252 |
| 6,710,473 B2 * | 3/2004 | Maksimov et al. | 307/89 |
| 6,771,078 B1 * | 8/2004 | McCauley et al. | 324/539 |
| 6,836,448 B2 * | 12/2004 | Robertsson et al. | 367/59 |
| 2004/0068174 A1 * | 4/2004 | Bowman | 600/410 |

FOREIGN PATENT DOCUMENTS

| | | |
|---|---|---|
| JP | 06 066843 A | 3/1994 |
| JP | 06066843 A | 3/1994 |
| WO | WO89/09411 * | 10/1989 |
| WO | WO 00/62083 * | 10/2000 |

OTHER PUBLICATIONS

Bernot et al., "Computation of magnetic flux density and iron losses by Fourier-Bessel and Fourier-Laurent series in an electromagnetic vibration damper", Jan. 1993, IEEE, IEE Proceedings B Electric Power Applications, vol. 140, issue 1, pp. 18-26.*

Ema et al., "Magnetic Fields Control by Single-sided Exciting Coils", 2000, Denki Gakkai Magunetikkusu Kenkyukai Shiryo, pp. 1-5.*

Translation of Ema et al., "Magnetic Fields Control by Single-sided Exciting Coils".*

\* cited by examiner

METHOD AND APPARATUS FOR DETERMINING A CURRENT IN A CONDUCTOR

CROSS-REFERENCE TO RELATED APPLICATIONS

This application is a continuation of PCT International Patent Application Number PCT/AU02/01566, filed Nov. 19, 2002, that elects the United States of America as a designated country, and claims priority to and the benefit of U.S. provisional patent application No. 60/331,560, filed Nov. 19. 2001.

FIELD OF THE INVENTION

The present invention relates to a method and apparatus for determining a current in a conductor, and particularly, though not exclusively, to a method and apparatus for determining a current in a high voltage transmission line. Throughout this specification the term "coil" is to be understood as meaning one or more electrically conductive winding(s).

BACKGROUND OF THE INVENTION

For metering and protection purposes it is necessary to measure currents in high voltage transmission lines. The current measurement is usually performed at the high voltage potential of the line while the gauging instrument comprises parts that are at or near earth potential, which require complicated insulation. Typically the equipment must work both for a single conductor and for a plurality of conductors carrying currents of different magnitudes and phases. Current shunts, for example, can be used to measure such a current. They may comprise an impedance series-connected with the conductor and the current can be estimated from the voltage across the impedance. Again, the measurement requires insulation between parts of the gauging instrument at or near earth potential and the impedance at high voltage potential.

Alternatively the current may be determined indirectly from the magnetic field generated by the conductor. Electrical contact with the conductor is not necessary which has the advantage that the measurement can be performed at or near earth potential. This method involves typically the use of a plurality of separate transformers and the measurement of the induced currents. The transformers may comprise iron or air cored toroidal coils surrounding the conductor carrying the current. These transformers can be manufactured with sufficient accuracy and linearity over a limited range, are relatively insensitive to magnetic fields generated by other nearby currents and can also provide energy for the operation of the equipment connected to them. Since toroidal coils surround the conductors, however, they require insulation between the conductor potential and earth potential. Because of the cost associated with this insulation such current transformers are relatively expensive.

Hall effect devices and coils mounted at or near earth potential are also used to measure the magnetic field generated by currents in a group of conductors. These techniques have the significant disadvantage that they detect the total magnetic field at their location. This may be influenced by a number of nearby conductors and it may be impossible to measure the magnetic field associated with only one particular conductor within the group. In three phase power systems, when a sensor is separated from a conductor by a safe working distance, which will prevent flashover under any circumstances, the other conductors are nearby and their contribution to the total magnetic field is significant. Hall effect devices and coils mounted at or near earth potential also have to cope with very low magnetic fields and therefore low signal strengths. The Hall effect and iron-cored coils also have linearity problems over large dynamic ranges.

An alternative method was proposed by Blatt (WO 89/09411). This documents discloses the measurement of the magnetic fields near every conductor within a group of conductors using a plurality of coils. A computer routine may then be employed to calculate the contribution of the magnetic fields of each of the neighbour conductors to that of a particular conductor. This method, however, is quite involved, as it requires the measurement of the fields near all conductors in the vicinity and also calibration.

It is therefore desirable to be able to provide an improved method and apparatus for determining, at earth potential, the current in a conductor.

SUMMARY OF THE INVENTION

The present invention provides in a first aspect a method of measuring a current in a conductor comprising the steps of:

determining the $n^{th}$ spatial derivative of at least one vector component of the magnetic field associated with the current at at least one position and calculating the current from the $n^{th}$ spatial derivative.

The magnetic field generated by the current in the conductor decays with $1/r$ where r is the distance from the conductor in a direction perpendicular to the direction of the current. The $n^{th}$ spatial derivative of the magnetic field, however, decays more rapidly with $1/r^{1+n}$. If the conductor is one of a group of conductors and the measurement is conducted closer to the one conductor than to the or each other conductor, the influence of the magnetic field generated by currents in other conductors is therefore reduced.

The method typically comprises the steps of:

determining at least one vector component of the magnetic field at at least two different positions and calculating the $n^{th}$ spatial derivative of the or each vector component for one of the positions from the or each vector component measured at the at least two different positions.

If the location of the conductor is unknown, the method may also comprise the step of determining the location of the conductor from the or each vector component measured at the at least two different positions. As the location of the conductor may be estimated from the result of the measurement itself, the method is self-calibrating.

In a specific embodiment of the present invention the $n^{th}$ spatial derivative is the second spatial derivative of the or each vector component of the magnetic field and typically is measured by coils at three different positions. The coils typically are positioned substantially equidistant on an imaginary line. The spatial derivative of the magnetic field component at the second (intermediate) position typically is approximated by $A-(2\times B)+C$ where A, B and C refer to the values measured by the coils for the component at the first, second and third position, respectively.

The conductor typically is elongate and the imaginary line may be oriented substantially perpendicular the conductor. Alternatively, the imaginary line may be oriented tangential to the outer surface of the conductor.

In one embodiment of the present invention the conductor is one of a group of conductors. In this case the or each measurement position may be closer to the one conductor than to the or each other conductor.

The method typically comprises the steps of:
measuring the magnetic field near the one conductor and near the or each other conductor,
determining the influence of the or each other conductor from the measured magnetic field near the or each other conductor and
subtracting the determined influence of the or each other conductor from the measurement for the one conductor.

The present invention provides in a second aspect a method of measuring a current in one conductor of a group of conductors within a three-phase high power line comprising the steps of:
determining at least one vector component of the magnetic field at at least two different positions which are closer to one the conductor than to each other conductor,
calculating the $n^{th}$ spatial derivative of the or each vector component for one of the positions from the or each vector component measured at the at least two different positions and
calculating the current through the one conductor from the $n^{th}$ spatial derivative.

The present invention provides in a third aspect an apparatus for measuring a current in a conductor, the apparatus comprising:
a means for determining at least one vector component of the magnetic field associated with the current at at least two different positions and
a means for determining the $n^{th}$ spatial derivative of at least one vector component of the magnetic field from the or each vector component of the magnetic field measured at the at least two different positions and a means for calculating the current from the $n^{th}$ spatial derivative.

The means for determining the or each vector component of the magnetic field typically comprises at least two coils arranged such that the magnetic field can be measured at at least two different positions. The at least two coils typically form a group and may be on an imaginary line.

In one specific embodiment of the present invention, the group is one of a plurality of groups and the apparatus comprises at least two groups of coils arranged such that the imaginary lines are substantially parallel to each other. Alternatively, the at least two groups of coils are arranged along one imaginary line. As a further alternative, two or three groups of coils may also be arranged such that the imaginary lines are substantially perpendicular to each other.

The invention was described above with respect to the measurement of a current in a conductor. The invention may, however, have other applications related to the measurement of a magnetic field generated by a current in a conductor.

The present invention provides in a fourth aspect a method of determining a magnetic field comprising the steps of:
determining a vector component of the magnetic field, which is associated with a current in a conductor, at at least two positions,
calculating the $n^{th}$ spatial derivative of the or each vector component for one position from the or each vector component measured at the at least two positions and
calculating the magnetic field at one of the positions from the $n^{th}$ spatial derivative.

The present invention provides in a fifth aspect an apparatus for determining a magnetic field associated with a current through the apparatus comprising:
at least two coils arranged such that, in use, at least one vector component of the magnetic field can be measured at at least two positions,
a means for calculating the $n^{th}$ spatial derivative of the or each vector component for one position from the or each vector component measured at the at least two positions and
a means for calculating the magnetic field at one of the positions from the $n^{th}$ spatial derivative.

Specific embodiments of the invention will now be described, by way of example only, with reference to the accompanying drawings.

DETAILED DESCRIPTION OF SPECIFIC EMBODIMENTS

Figure 1:
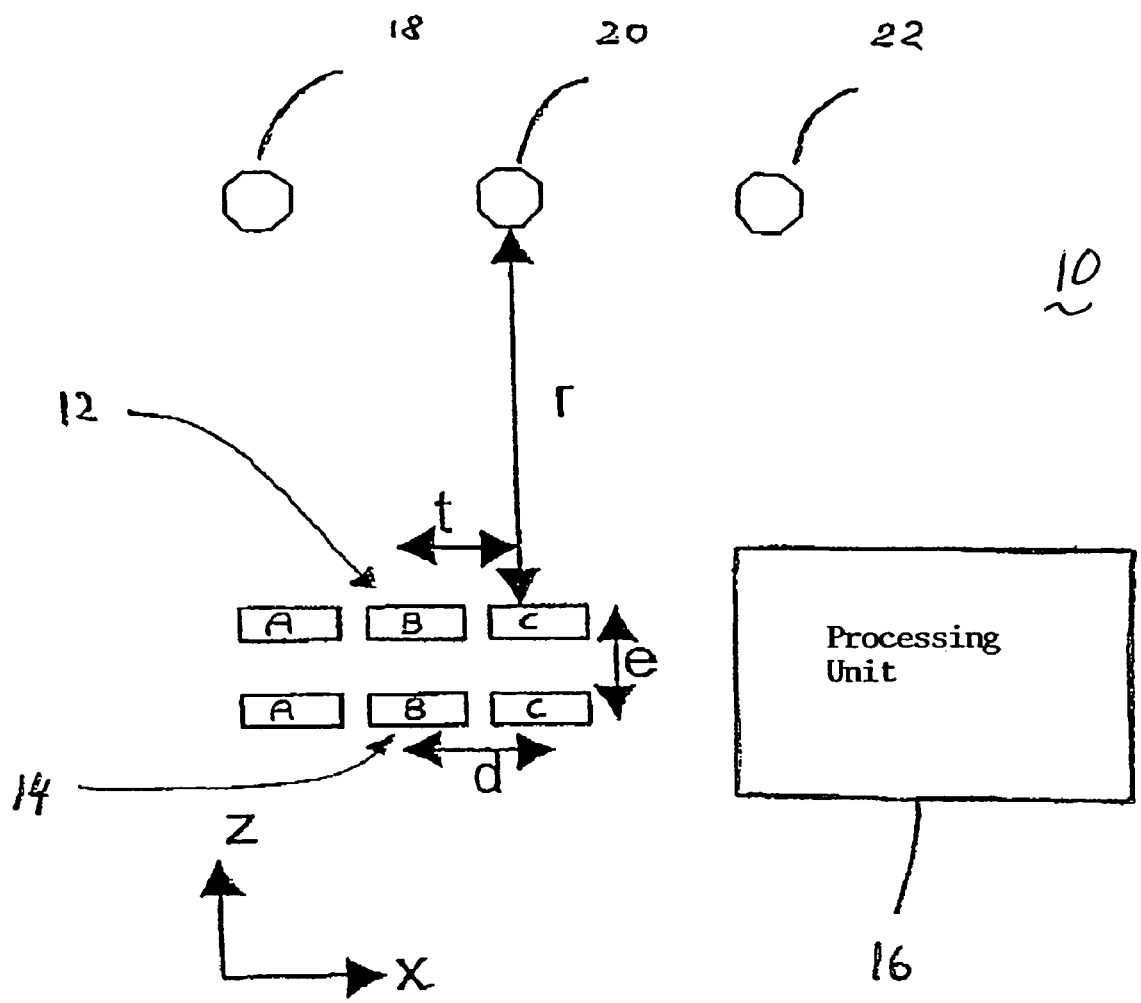
FIG. 1 shows a cross-sectional representation of an apparatus for determining a current in a conductor according to a specific embodiment of the invention.

Referring to FIG. 1, the apparatus for determining a current in a conductor according to the specific embodiment of the invention and a method for determining a current according to a specific embodiment are now described. FIG. 1 shows the apparatus 10 comprising a pair of triplets 12 and 14, each comprising coils A, B and C, and a processing unit 16 which functions to process measurement data. Each triplet is arranged near three conductors 18, 20, and 22. The three conductors may be conductors of an electrical distribution system. Each triplet is oriented along a tangential direction (t) of the conductors and perpendicular to the elongation of the conductors. Both triplets are positioned parallel to each other and offset in radial direction (r) with respect to each other and the conductors. The coils within each triplet are connected together so that their current output, when in use, equals the sum of the output of the outer coils minus twice the output of the centre coil (A−2×B+C). In this arrangement, the output current is a measure for the second spatial derivative $\delta B/\delta x^2$ of the magnetic field generated by the conductors 18, 20 and 22.

It will be appreciated that this representation shows one of many possible combinations that may be used. It is not necessary to position the triplets targeting a conductor in any particular location relative to the conductor. Whilst the coils will typically measure magnetic fields tangential to the target conductor for straight conductors, for not-straight conductors magnetic fields in all three dimensions may be monitored. The spatial derivative also need not be the second derivative, other coil arrangements can produce other spatial derivatives of the magnetic field.

In case of the example shown in FIG. 1 the output of a coil, when in use, measures the magnetic field $B_x$ generated by the current through the conductors in the y direction and the output of each triplet 12 and 14 is a measure for $\partial^2 B_x/\partial x^2$. If the coil assembly is moved through the magnetic field in the x direction, the output current of the single coil changes relatively slowly when moved past a particular one of the three conductors 18, 20 and 22. The output current of each one of the triplets, however, increases or decreases much more rapidly when approaching or moving away from a particular conductor which indicates that in this case the magnetic field influence from neighbour conductors is reduced.

It will now be described how the current through at least one of the conductors and the position of the conductor relative to the triplets can be estimated. For this example the origin of a (t, a, r) coordination system (t: direction tangential to conductors, a: direction parallel the conductors and r: radial direction with respect to conductor 20) coincides with the centre coil B of triplet 12. The value of the magnetic field in the tangential direction at coil B is given by:

$$Bt(0,0,0) = (\mu_0/(2\times\pi)) \times I \times (-r/(t^2+r^2)) \quad (1)$$

The output of triplet 14 is $$TM_{t(t=d)}(f,0,-e) = +2d^2 \times ((\mu_0/(2\times\pi)) \times (+I) \times \{(r+e) \times ((r+e)^2 - 3(t-f)^2 + d^2)\} / ((r+e)^2 + (t+d-f)^2) \times ((r+e)^2 + (t-f)^2) \times ((r+e)^2 + (t-d-f)^2) \quad (2)$$

where "f" is a tangential offset and "e" a radial offset between triplets and "d" is a tangential offset of the coils within each triplet.

For the case in FIG. 1 with f=0, r>>d and r>t the measured triplet output "TM" is $$TM_{t(t=d)}(0,0,-e) = +2d^2 \times ((\mu_0/(2\times\pi)) \times (+I)/(r+e)^3 \quad (3)$$

This shows the inverse cubic drop off of the triplet output.

Using equation 3 for the arrangement shown in FIG. 1 a first estimate of the current "I" in a conductor is given by the equation:

$$I_a = I_y = [(e^3/2d^2) \times (2\times\pi/\mu_0)] \times TM_{t(t=d)}(0,0,0) / [TM_{t(t=d)}(0,0,0)^{1/3}/TM_{t(t=d)}(0,0,-e)^{1/3}-1]^3 \quad (4)$$

Using the value of "I" calculated in equation (4) and the output from one of the triplets the distance to the current carrying conductor can be calculated from $$r = [(2d^2) \times (\mu_0/(2\times\pi)) \times I_a/TM_{t(t=d)}(0,0,0)]^{1/3} \quad (5)$$

It will be appreciated that the same principle can also be used to determine both the current in the conductor and the distance to the conductor in the tangential direction.

If the conductor is one of a group of conductors carrying currents, the influence of the magnetic field generated by other conductors on the measurement may be further reduced by calculating their influence and subtracting it from the measurement. For calculating the influence of magnetic field generated by currents in other conductors each current in other conductors may be estimated in a manner analogous to that described above. The influence of the other conductors on the measurement of a particular conductor can be minimised further by calculating their influence at the position of measurement and subtracting it from the measured value.

$$TM_{t(t=d)m(n=m)(s)} = \{TM_{t(t=d)m(n=m)(s=1)} - \Sigma TC_{t(t=d)m(n\neq m)(s)}\} \quad (6)$$

i.e. The measured triplet (TM) of tangential magnetic field (t) using a tangential offset of "d" (t=d) for Triplet "m" near conductor "n" when n=m (n=m) for step s (s) is equal to the measured value of the same entity for the step s=1 (s=1) minus the sum of the calculated triplet responses for triplet "m" from all the conductors "n" when n≠m.

The calculated triplet responses are obtained using:

$$TC_{t(t=d)m(n\neq m)(s=2)} = (2d^2) \times (\mu_0/(2\times\pi)) \times I_{an(n\neq m)(p=1)} \times r_{mn(n\neq m)(q=1)} \times (r_{mn(n\neq m)(q=1)}^2 - 3 \times t_{mn(n\neq m)(q=1)}^2) / (r_{mn(n\neq m)(q=1)}^2 + t_{mn(n\neq m)(q=1)}^2)^3 \quad (7)$$

i.e. using the first approximation (p=1) of the axial current "I" on conductor "n" where n≠m and the first approximation (q=1) of the radial spacing "r" between sensor "m" and conductor "n" where n≠m and similarly the tangential spacing "t" between "m" and "n". The corrected triplet responses are then used to calculate the second estimate of the amplitude of the current and the location of each current carrying conductor for that point in time.

After the second estimate of the current amplitude and location has been performed, locational and current data is available for all the conductors in the group of conductors. This means the third and subsequent estimates can be performed with equations containing less approximations than those used for the first estimates.

Figure 2:
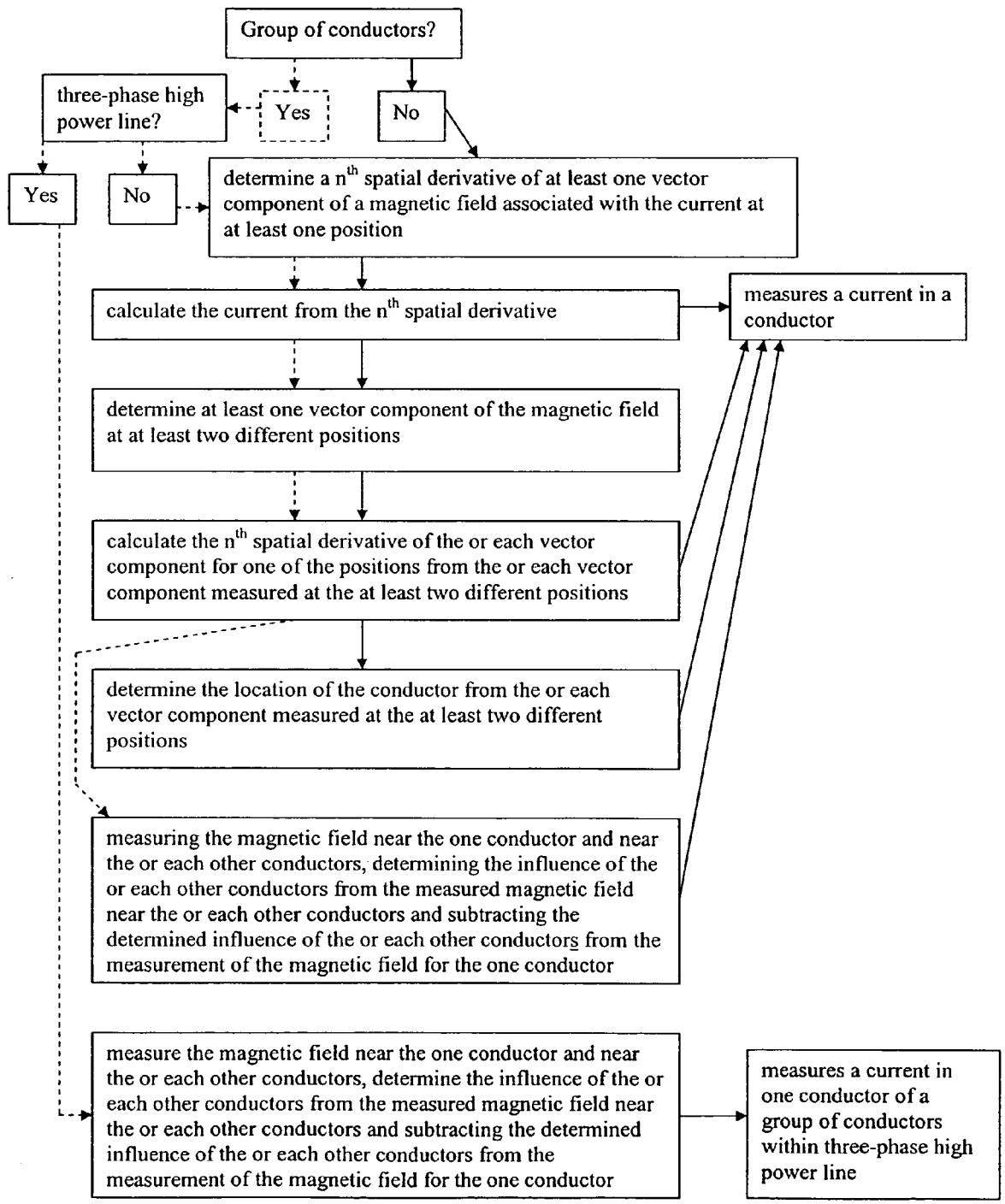
FIG. 2 is a flow-chart representation of various methods of the present invention.

Various embodiments of the methods disclosed herein are shown in FIG. 2.

Although the invention has been described with reference to particular examples, it will be appreciated by those skilled in the art that the invention may be embodied in many other forms.

The invention claimed is:

1. A method of measuring a current, the method comprising the steps of:
   causing a magnetic field associated with the current in a conductor to change an apparatus that is influenceable by the magnetic field from a first state to a second state corresponding to a position of the apparatus in the magnetic field;
   determining from the second state of the apparatus at least one vector component of a magnetic field associated with the current in the conductor at at least two different positions;
   measuring an $n^{th}$ spatial derivative of the, or each, vector component determined for one of the positions, wherein n is an integer greater than zero; and
   calculating the current of the conductor from an estimate of the $n^{th}$ spatial derivative of the magnetic field, wherein n is an integer greater than zero and the estimate of the $n^{th}$ spatial derivative of the magnetic field is based on the measured $n^{th}$ spatial derivative of the, or each, vector component.

2. The method as claimed in claim 1 further comprising the steps of:
   determining at least one vector component of the magnetic field at at least two different positions; and
   calculating the $n^{th}$ spatial derivative of the or each vector component for one of the positions from the or each vector component measured at the at least two different positions.

3. The method as claimed in claim 2 further comprising the additional step of determining the location of the conductor from the or each vector component measured at the at least two different positions.

4. The method as claimed in claim 3 wherein the or each vector component of the magnetic field is measured by coils at three different positions.

5. The method as claimed in claim 4 wherein the coils are positioned substantially equidistant on an imaginary line.

6. The method as claimed in claim 5 wherein the $n^{th}$ spatial derivative of the magnetic field component at a second position is approximated by A—(2×B)+C where A, B and C refer to the values measured by the coils for the magnetic field component at the first, second and third position, respectively.

7. The method as claimed in claim 5 wherein the conductor is elongate and the imaginary line is oriented substantially perpendicular to the conductor.

8. The method as claimed in claim 7 wherein the imaginary line is oriented tangential to the outer surface of the conductor.

9. The method as claimed in claim 2 wherein the conductor is one of a group of conductors and the or each measurement position is closer to the one conductor than to the or each other conductors.

10. The method as claimed in claim 9 further comprising the steps of;
measuring the magnetic field near the one conductor and near the or each other conductors,
determining the influence of the or each other conductors from the measured magnetic field near the or each other conductor and
subtracting the determined influence of the or each other conductors from the measurement for the one conductor.

11. The method as claimed in claim 1 wherein the $n^{th}$ spatial derivative is the second spatial derivative.

12. The method as claimed in claim 1 wherein the or each vector component of the magnetic field is determined by orienting at least one coil in a predetermined position relative to the conductor, measuring the induced current in the at least one coil and determining the or each vector component of the magnetic field from the measured induced current.

13. The method of claim 1 wherein the apparatus further includes a processing unit for calculating the current measurements, the apparatus communicating its state to the processing unit.

14. The method of claim 1 wherein the calculation is made by a processing unit associated with the apparatus.

15. The method of claim 1 wherein the conductor comprises a high voltage transmission line.

16. A method of measuring a current in one conductor of a group of conductors within a three-phase high power line comprising the steps of:
causing a magnetic field associated with the current in the conductor to change an apparatus that is influenceable by the magnetic field from a first state to a second state corresponding to a position of the apparatus in the magnetic field;
from the second state of the apparatus, determining at least one vector component of a magnetic field at at least two different positions which are closer to one conductor of a group of conductors than to each of the other conductors of the group of conductors,
calculating an $n^{th}$ spatial derivative of the or each vector component for one of the positions,
wherein n is an integer grater than zero; and
calculating the current through the one conductor from an estimate of the $n^{th}$ spatial derivative of the magnetic field, wherein n is an integer greater than zero and the estimate of the $n^{th}$ spatial derivative of the magnetic field is based on the calculated $n^{th}$ spatial derivative of the, or each, vector component.

17. The method of claim 16 wherein the conductor comprises a high voltage transmission line.

18. An apparatus for measuring a current in a conductor, the apparatus comprising:
a means that is influenceable by a magnetic field from a first state to a second state corresponding to a position of the means in the magnetic field; a means for determining at least one vector component of the magnetic field at at least two different positions from the second state of the apparatus at the positions;
a means for calculating a $n^{th}$ spatial derivative of the or each vector component of the magnetic field from one of the at least two positions, wherein n is an integer greater than zero; and
a means for calculating the current of the conductor from an estimate of the $n^{th}$ spatial derivative of the magnetic field at a location adjacent to the conductor, wherein n is an integer greater than zero and the estimate of the $n^{th}$ spatial derivative of the magnetic field is based on the calculated $n^{th}$ spatial derivative of the or each vector component.

19. The apparatus as claimed in claim 18 wherein the means for determining the or each vector component of the magnetic field comprises at least two coils arranged relative to one another such that the magnetic field can be measured at at least two different positions.

20. The apparatus as claimed in claim 19 wherein the at least two coils form a group and are on an imaginary line.

21. The apparatus as claimed in claim 20 wherein the group is one of a plurality of groups.

22. The apparatus as claimed in claim 21 further comprising at least two groups of coils arranged relative to one another such that the imaginary line of each group is substantially parallel to each other.

23. The apparatus as claimed in claim 21 further comprising at least two groups of coils arranged along one imaginary line.

24. The apparatus as claimed in claim 21 further comprising two or three groups of coils arranged such that the imaginary line of each group is substantially perpendicular to each other.

25. The apparatus of claim 18, further comprising a processing unit for making the calculation, the apparatus being adapted to communicate its state to the processing unit.

* * * * *